United States Patent
Ho et al.

(10) Patent No.: US 7,414,282 B2
(45) Date of Patent: Aug. 19, 2008

(54) METHOD OF MANUFACTURING A NON-VOLATILE MEMORY DEVICE

(75) Inventors: Chiahua Ho, Kaohsiung (TW);
Yen-Hao Shih, Changhua County (TW);
Hang-Ting Lue, Hsinchu (TW);
Erh-Kun Lai, Taichung County (TW);
Kuang Yeu Hsieh, Hsin Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 124 days.

(21) Appl. No.: 11/203,087

(22) Filed: Aug. 15, 2005

(65) Prior Publication Data
US 2007/0037328 A1 Feb. 15, 2007

(51) Int. Cl.
*H01L 29/76* (2006.01)
(52) U.S. Cl. .................. 257/314; 257/315; 257/317
(58) Field of Classification Search ............... 438/151; 257/314, 315, 317, 318, 321
See application file for complete search history.

(56) References Cited

U.S. PATENT DOCUMENTS

| | | | |
|---|---|---|---|
| 4,652,897 A | 3/1987 | Okuyama et al. | |
| 5,100,819 A | 3/1992 | Gill et al. | |
| 5,674,764 A | 10/1997 | Liu et al. | |
| 5,898,614 A | 4/1999 | Takeuchi | |
| 6,133,098 A | 10/2000 | Ogura et al. | |
| 6,501,124 B2 | 12/2002 | Kim | |
| 6,630,384 B1 | 10/2003 | Sun et al. | |
| 6,727,128 B2 | 4/2004 | Sridevan | |
| 6,771,545 B1 * | 8/2004 | Hsia et al. | 365/185.29 |
| 2003/0155599 A1 | 8/2003 | Hsu et al. | |
| 2004/0051134 A1 * | 3/2004 | Jang et al. | 257/316 |
| 2004/0084718 A1 | 5/2004 | Hung et al. | |
| 2004/0100822 A1 | 5/2004 | Roizin et al. | |
| 2004/0219802 A1 * | 11/2004 | Park et al. | 438/780 |
| 2005/0012159 A1 | 1/2005 | Sekimoto | |
| 2006/0197139 A1 * | 9/2006 | Wu et al. | 257/315 |
| 2007/0059945 A1 | 3/2007 | Mohklesi | |

OTHER PUBLICATIONS

R. Shirota et al., " An Accurate Model of Subbreakdown Due to Band-To-Band Tunneling and its Application," IEDM, Dec. 1988, pp. 26-29.

T. Ohnakado et al., "Novel Electron Injection Method Using Band-toBand Tunneling Induced Hot Electron (BBHE) for Flash Memory with a P-channel Cell," IEDM, Dec. 1995, pp. 279-282.

* cited by examiner

*Primary Examiner*—Kevin M Picardat
(74) *Attorney, Agent, or Firm*—Finnegan, Henderson, Farabow, Garrett & Dunner, LLP

(57) ABSTRACT

A method of manufacturing a non-volatile semiconductor memory device includes forming a sub-gate without an additional mask. A low word-line resistance is formed by a metal silicide layer on a main gate of the memory device. In operation, application of a voltage to the sub-gate forms a transient state inversion layer that serves as a bit-line, so that no implantation is required to form the bit-line.

17 Claims, 9 Drawing Sheets

METHOD OF MANUFACTURING A NON-VOLATILE MEMORY DEVICE

TECHNICAL FIELD

This invention is related to the manufacture of memory devices. More importantly, it is directed to a novel method of manufacturing a non-volatile memory device.

BACKGROUND

Non-volatile memory devices are extensively used for storing information. Unlike volatile memory, non-volatile memory is able to retain stored information in the absence of a constant power source. Examples of such devices include Read-only memory (ROM), programmable ROM (PROM), erasable PROM (EPROM), electrically erasable programmable ROM (EEPROM), and flash EEPROM, what is typically referred to as flash memory.

Memory devices are generally composed of arrays of memory cells. A flash memory cell offers the advantage that it may be erased in blocks of data instead of one byte at a time. Each memory cell includes a MOS structure having a gate, a drain, a source and a channel defined between the drain and the source. The gate corresponds to a word line, and the drain or source corresponds to a bit-line of the memory array. A conventional flash memory cell generally includes a layer provided between the gate and the channel for trapping charge carriers. The charge-trapping layer can be a dielectric such as silicon nitride. The memory cell may be programmed by appropriately biasing the gate, the source, and the drain such that charge carriers (electrons or holes) are forced to tunnel or be injected into the trapping layer, effectively trapping the carriers. Applying different biases to the gate, the drain, and the source will allow the memory cell to be read or erased.

As the need for storing more information increases, it becomes necessary to manufacture more memory cells per device, while attempting to either keep the device the same size, or to make it even smaller, requiring increased scalability of memory cells. As the gate size is reduced, the channel between the source and drain region becomes increasingly reduced such that a gradual shorting together of the diffusions of the source and drain may occur. This is known as the "short channel effect", and it is limited by the total amount of thermal energy transferred to the wafer during the given elevated temperature and duration of the manufacturing process, known as the thermal budget. In order to prevent the short channel effect, it is desirable to reduce the thermal budget. Prior art methods of manufacturing non-volatile memory devices have been limited in their attempts to scale the size of memory cells because of this short channel effect.

FIG. 1 shows a conventional non-volatile read-only memory (NROM) cell 100 representative of an array of memory cells. A dielectric stack consisting of an oxide layer 108, a silicon nitride layer 110, and a second oxide layer 112 is first formed on a p-type semiconductor substrate 102. The silicon nitride layer 110 acts as the charge trapping layer, and the insulating oxide layers prevent the charge from escaping the trapping layer in the absence of the appropriate biases. N-type diffusion regions 104, 106 are formed in semiconductor substrate 102 using conventional implantation methods. Memory device 100 is an n-type MOS transistor with diffusion regions 104, 106 respectively acting as the source and drain thereof. A main gate 114 is formed on second oxide layer 112 and is part of a word-line. By applying appropriate biasing voltages to the main gate 114, source 104, and drain 106, electrons may tunnel into and out of silicon nitride layer 112, as a result of which memory cell 100 may be programmed, read or erased.

The conventional manufacturing method suffers from high word-line resistance. Furthermore, the conventional manufacturing method is less scalable, because the thermal budget associated with the manufacturing process creates short channel effects as the size of the memory cell is reduced.

SUMMARY

Consistent with the invention, there is provided a method of manufacturing a non-volatile memory device. The method comprises providing a substrate having a charge-trapping stack and a first polysilicon layer formed thereon; selectively patterning the charge-trapping stack and the first polysilicon layer to form a gate structure; forming an insulating layer and a second polysilicon layer on the substrate; selectively patterning the second polysilicon layer to form a sub-gate structure; forming a third polysilicon layer over the gate structure and sub-gate structure; forming a metal silicide layer over the third polysilicon layer; and selectively patterning the metal silicide, the first polysilicon layer, and the third polysilicon layer to form a main gate.

Also in accordance with the present invention, there is provided a method of manufacturing a non-volatile memory device. The method comprises providing a substrate; forming a charge-trapping stack over the substrate; forming a first gate layer over the charge-trapping stack; forming a nitride layer over the first gate layer; selectively patterning the charge-trapping stack, the first gate layer, and the nitride layer to form gate structures in a first direction such that portions of the substrate are exposed; forming an insulation layer surrounding the gate structures and over the exposed substrate; forming a second gate layer over the insulation layer; selectively patterning the second gate layer to form sub-gates; forming a hard mask layer over the sub-gate; selectively removing the nitride layer of the gate structure to expose the first gate layer; forming a third gate layer over the first gate layer and the hard mask layer; forming a metal silicide layer over the third gate layer; and selectively patterning the third gate layer and the metal silicide layer in a second direction perpendicular to the first direction.

Further in accordance with the present invention, there is provided a method of manufacturing a non-volatile semiconductor memory device. The method comprises providing a substrate having a charge-trapping stack and a first polysilicon layer formed thereon; selectively patterning through the charge-trapping stack and the first polysilicon layer to expose the substrate and form a gate structure; forming an insulating layer and a second polysilicon layer on the exposed substrate; selectively patterning the second polysilicon layer to form a sub-gate structure; forming a hard mask on the sub-gate; and forming a third polysilicon layer over the gate structure and hard mask, so that application of a voltage to the sub-gate forms a transient state inversion layer in the substrate.

Additionally in accordance with the present invention, there is provided non-volatile semiconductor device comprising a semiconductor substrate; a charge-trapping stack located over at least a first portion of the semiconductor substrate; a sub-gate over at least a second portion of the semiconductor substrate; and a main gate over the charge-trapping stack, wherein the main gate comprises a metal silicide.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments consistent with the invention, examples of which are illustrated in the accompanying drawings. Wherever possible, the same reference numbers will be used throughout the drawings to refer to the same or like parts.

Figure 1:
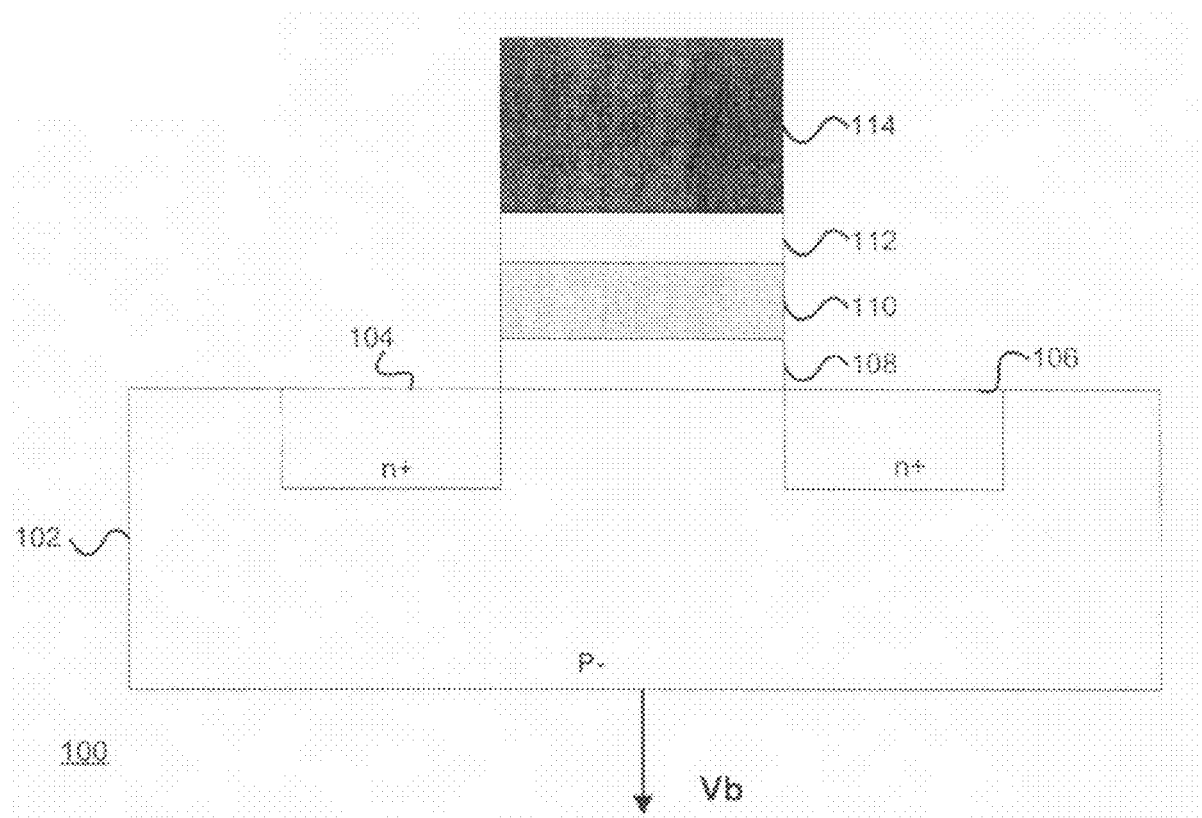
FIG. 1 is a conventional memory cell representative of an array of memory cells.
Figure 2A:
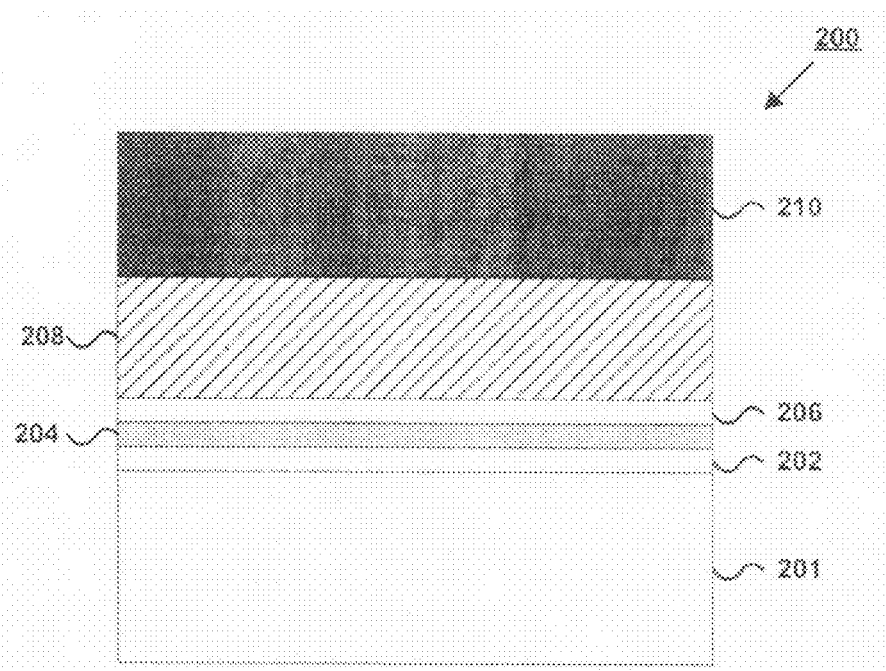
FIGS. 2A-2K illustrate a novel method of manufacturing a non-volatile memory device consistent with an embodiment of the present invention.

FIGS. 2A-2J illustrate a novel method of manufacturing a non-volatile memory device consistent with the present invention. As shown in FIG. 2A, a memory device 200 includes a charge-trapping stack, comprising a first insulation layer 202, a charge-trapping layer 204, and a second insulation layer 206 formed on a semiconductor substrate 201. First and second insulation layers 202 and 206 may comprise silicon oxide layers each having a thickness of about 5-15 nm. Charge-trapping layer 204 may comprise a silicon nitride layer having a thickness of about 2-8 nm. Charge-trapping layer 204 may instead comprise a material with a high dielectric constant, known as a high-k material, with a dielectric constant k larger than 4, and having a thickness of about 2-8 nm. Examples of suitable high-k materials include aluminum oxide and hafnium oxide. As another alternative, charge-trapping layer 204 may comprise a trilayer of silicon nitride/silicon dioxide/silicon nitride, wherein each layer of the trilayer has a thickness of about 2-8 nm. A first polysilicon layer 208 is formed over second insulation layer 206 by suitable techniques. First polysilicon layer 208 can have a thickness of 30-100 nm, and may further be doped with n-type impurities, p-type impurities, or not be doped at all. A silicon nitride layer 210 is formed on first polysilicon layer 208, and may have a thickness of about 50-200 nm.

Figure 2B:
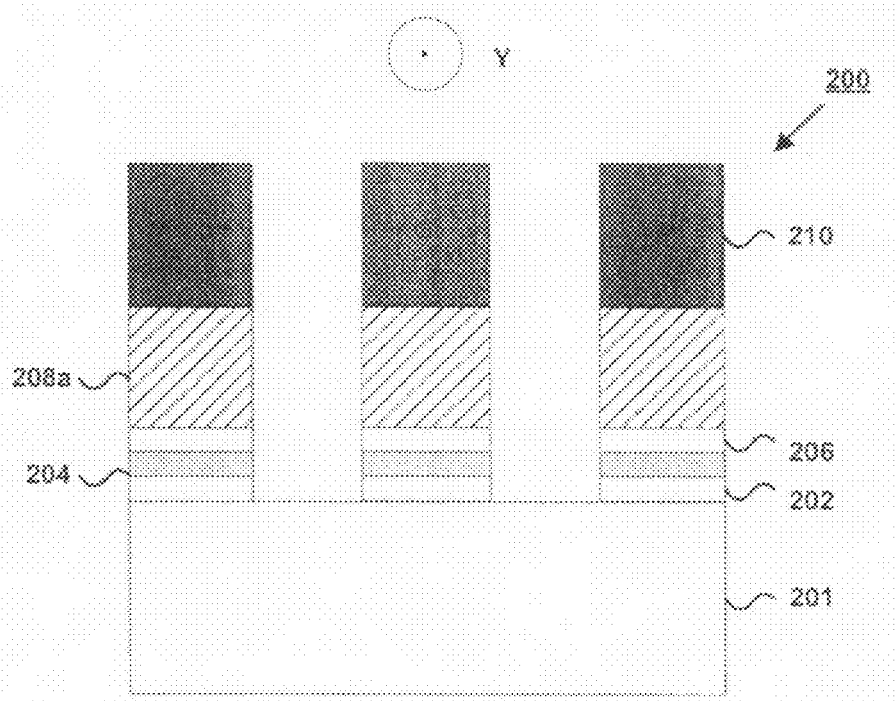

As shown in FIG. 2B, silicon nitride layer 210, first polysilicon layer 208, first insulation layer 202, charge-trapping layer 204, and second insulation layer 206 are selectively patterned in a first direction, for example, in a y-direction (perpendicular to the plane of the drawing of FIG. 2B), using suitable techniques, including, for example, conventional dry etching methods to form a series of first patterned lines. In an embodiment consistent with the present invention, first insulation layer 202, charge-trapping layer 204, and second insulation layer 206 comprise an oxide-nitride-oxide (ONO) stack, and the patterning process patterns through the entire ONO dielectric stack 202, 204, 206 and stops at substrate 201. Unlike conventional methods, the patterning does not require the selectivity that is required to stop the patterning at charge-trapping layer 204 and instead stops at substrate 201, resulting in a less difficult and less costly process. First polysilicon layer 208 is patterned to form bottom word-line gates 208a.

Figure 2C:
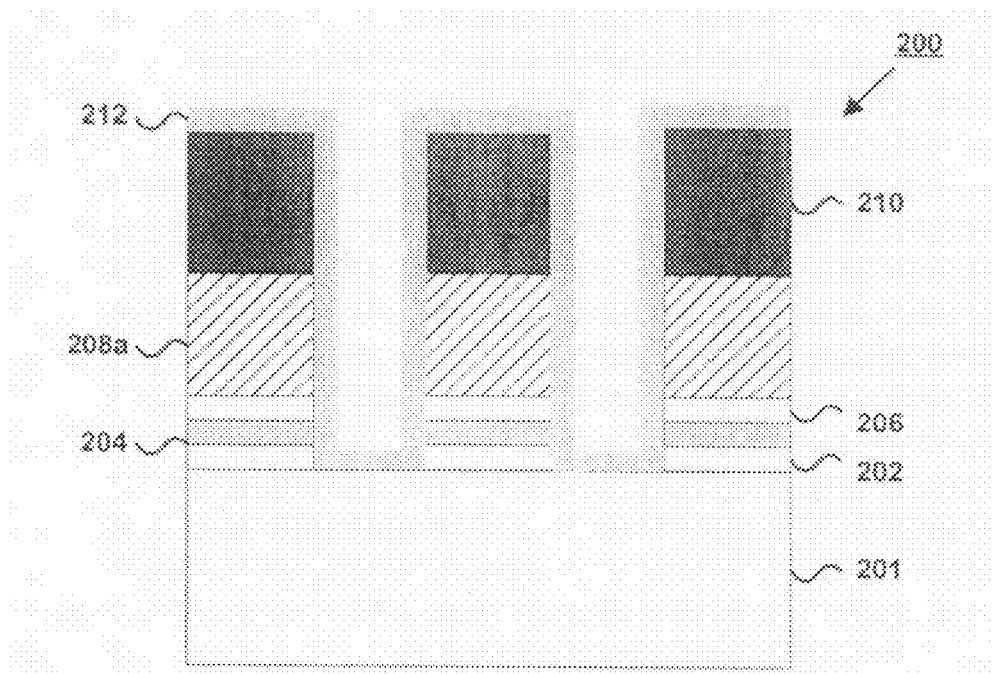

As shown in FIG. 2C, an isolation liner 212 is formed over silicon nitride layer 210, substrate 201, and the sidewalls of first polysilicon layer 208, insulation layers 202, 206, and charge-trapping layer 204, using any suitable means, such as low pressure chemical vapor deposition (LPCVD). According to one embodiment consistent with the present invention, isolation liner 212 may be an oxide deposited by LPCVD using $SiH_4$ and $N_2$ at about 700-900° C. to have a thickness of about 5-40 nm. According to another embodiment consistent with the present invention isolation liner 212 can be an oxide liner grown using dry oxidation, wet oxidation, or rapid thermal processing (RTP) oxidation at about 750-1100° C.

Figure 2D:
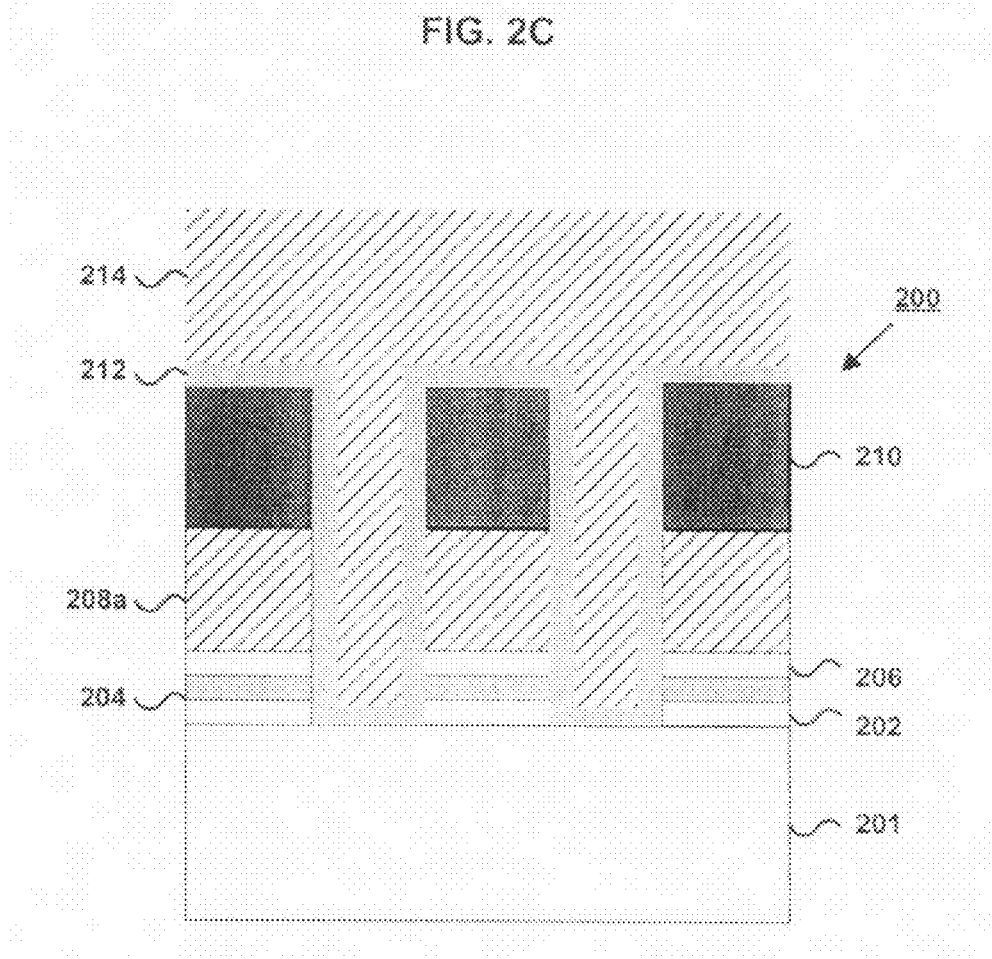
Figure 2E:
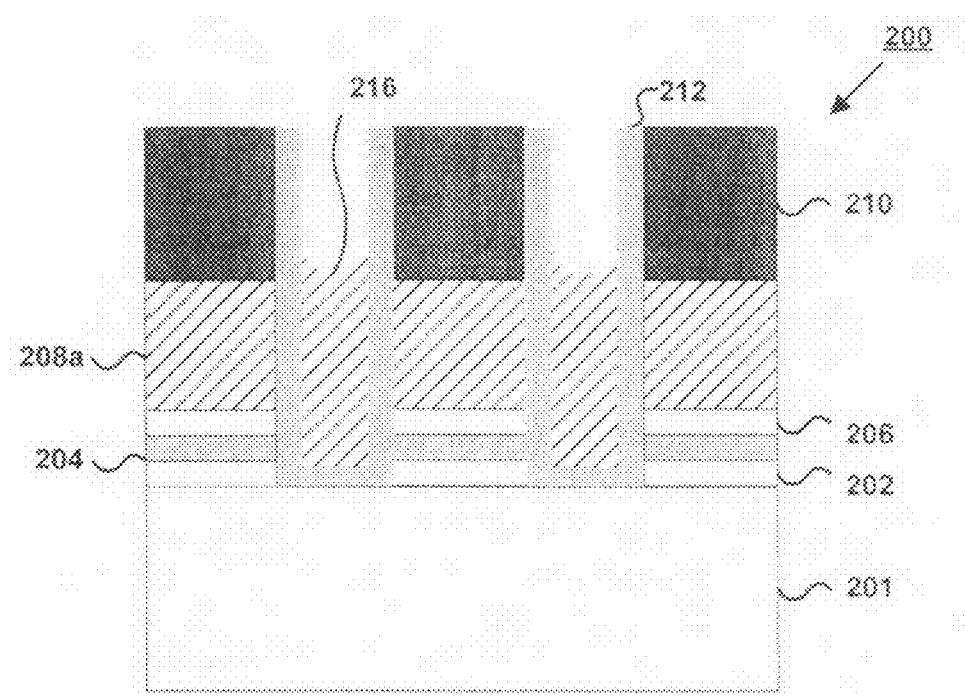

FIG. 2D shows that a second polysilicon layer 214 is formed over isolation liner 212. Second polysilicon layer 214 fills in an interspace between the first patterned lines, and is between bottom word-line gates 208a. Second polysilicon layer 214 may have a thickness of about 80-300 nm measured from the top of isolation liner 212, and can have n doping, p doping, or no doping at all. As shown in FIG. 2E, second polysilicon layer 214 is then etched back to form a sub-gate 216 that includes the polysilicon filled in between bottom word-line gates 208a. A high over-etch of second polysilicon layer 214 is used to create a sub-gate 216. The thickness of sub-gate 216 may range between about 50-200 nm. During this etch, isolation liner 212 is also removed from the top of silicon nitride layer 210.

According to another embodiment consistent with the present invention, sub-gate 216 can be formed by a chemical mechanical polishing (CMP) technique using the stop layer of, for example, isolation liner 212, or silicon nitride layer 210. A high over-polish is needed to completely remove second polysilicon layer 214 over the top of silicon nitride layer 210.

Figure 2F:
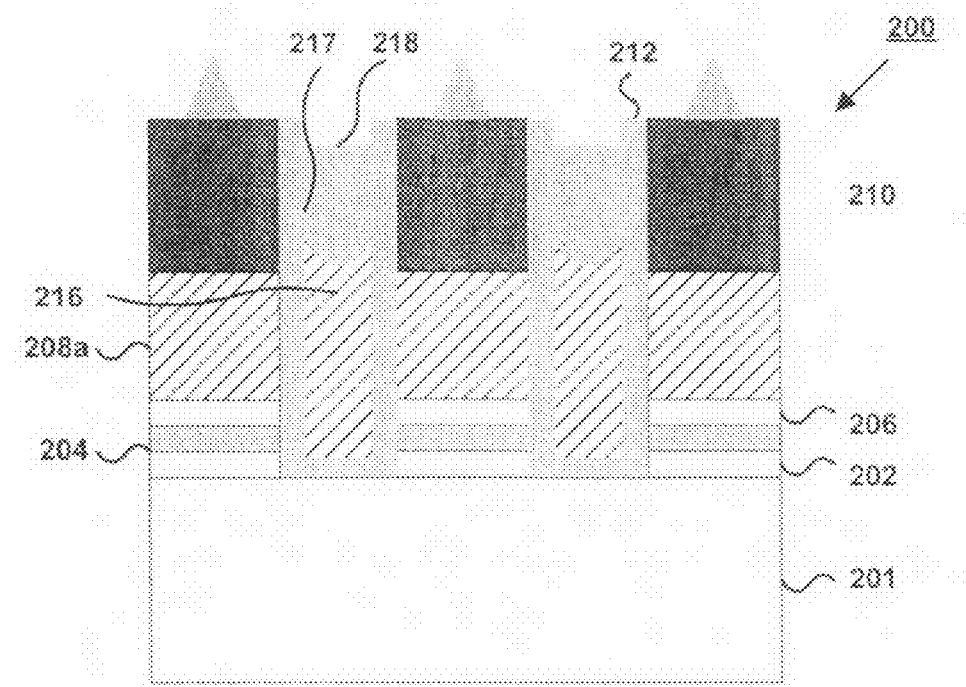

As shown in FIG. 2F, in an embodiment consistent with the present invention, a plasma dielectric material 217 is filled in over the sub-gate 216. Plasma dielectric material 217 is further formed over isolation liner 212 to form a plasma dielectric 218 comprising plasma dielectric material 217 and isolation liner 212 for isolating between sub-gate 216 and word-line bottom gate 208a. Plasma dielectric material 217 may comprise a high density plasma (HDP) oxide, and serves not only to provide additional isolation between sub-gate 216 and word-line bottom gate 208a, but is also used, for example, as a hard mask over sub-gate 216 for future patterning.

Figure 2G:
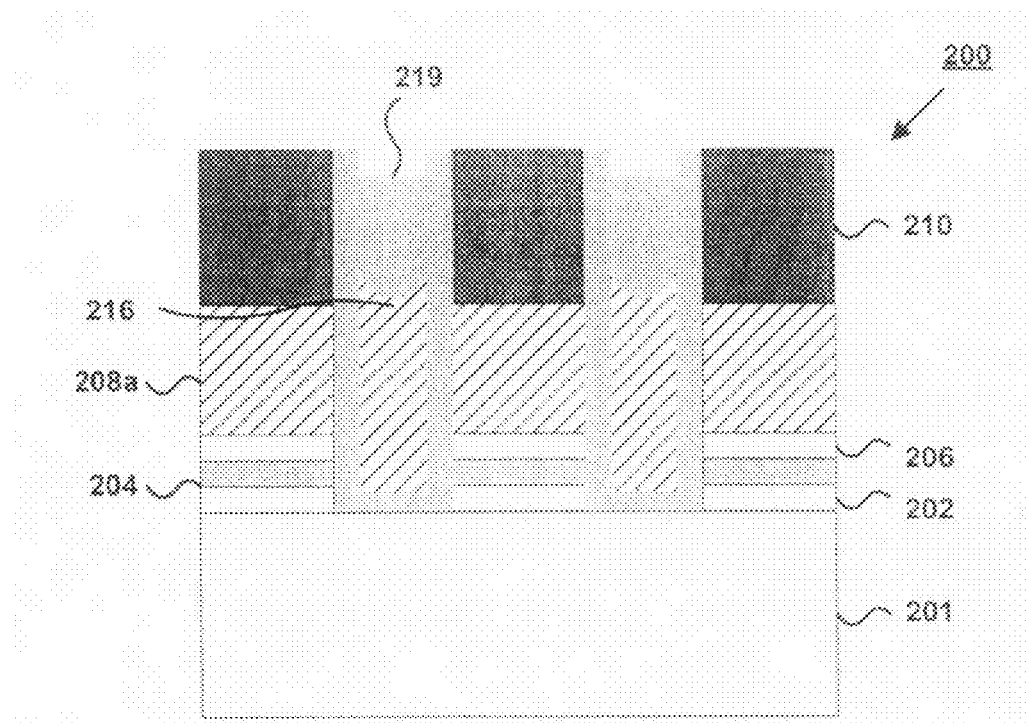

As shown in FIG. 2G, consistent with another embodiment of the present invention, and as an alternative to the formation of plasma dielectric 217, oxidation may be performed on sub-gate 216 to grow an oxide layer 219 having a thickness of about 10-30 nm. Oxide layer 219 may also be used as a hard mask for sub-gate 216 in future patterning steps.

Figure 2H:
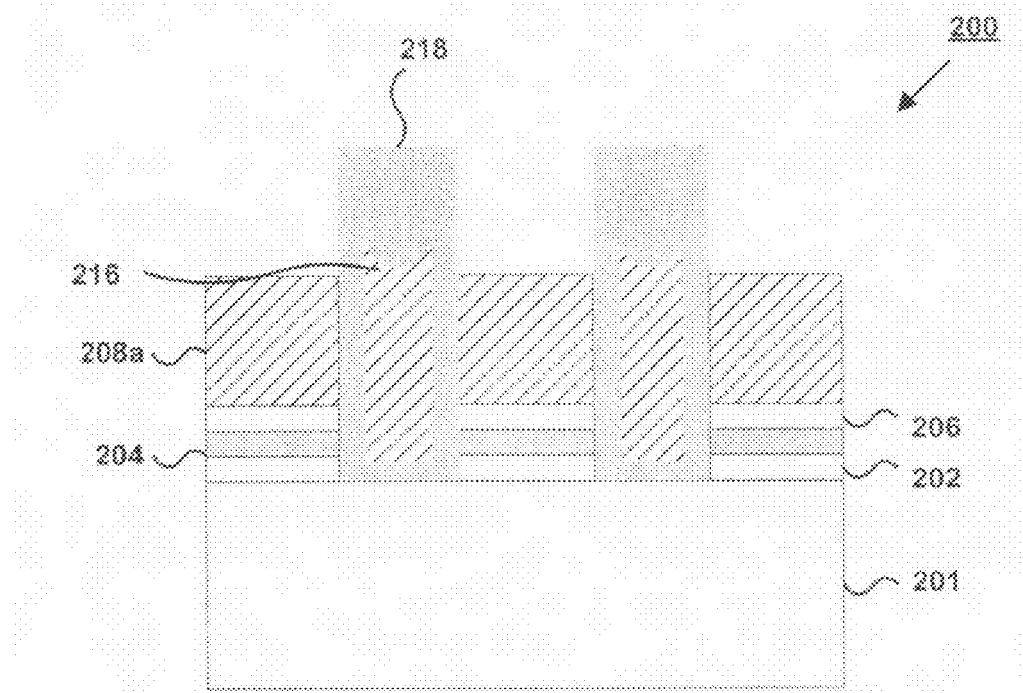

As shown in FIG. 2H, silicon nitride layer 210 is selectively removed using suitable techniques. In an embodiment consistent with the present invention, wet chemical etching using hot phosphoric acid may be used to remove silicon nitride layer 210. Plasma dielectric 218 acts as a mask, preventing the removal of sub-gate 216.

Figure 2I:
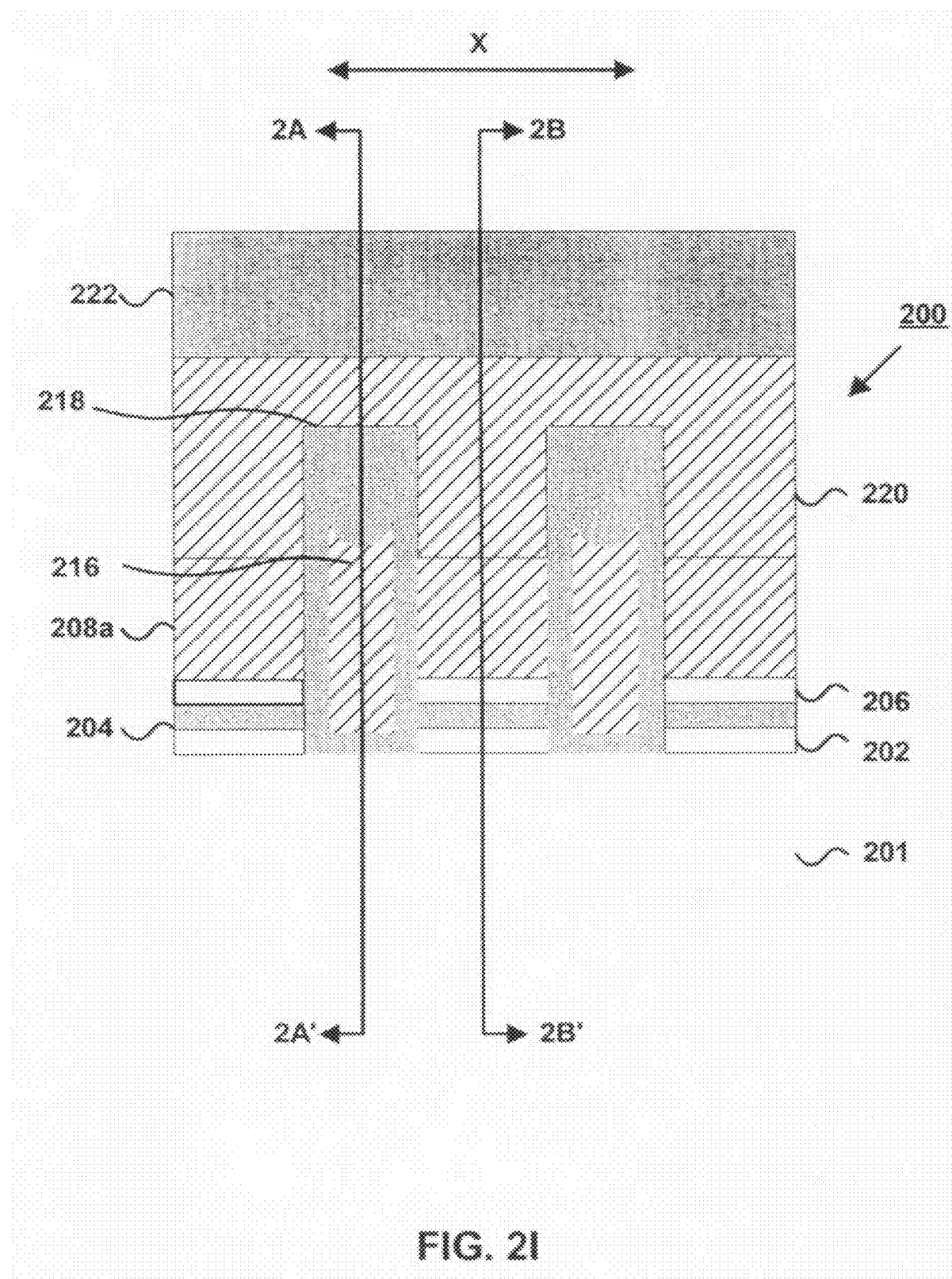

Referring to FIG. 2I, a third polysilicon layer 220 is deposited over word-line bottom gate 208a and plasma dielectric 218 using suitable techniques. Third polysilicon layer may have a thickness of about 30-100 nm, and may have n doping, p doping, or no doping at all. A metal silicide layer 222 is deposited over third polysilicon layer 220 using suitable techniques. Metal silicide layer 222 may have a thickness of about 50-200 nm, and may be provided as $TiSi_x$, $WSi_x$, $CoSi_x$, or $NiSi_x$, or any similar metal silicide. Metal silicide layer 222 and third polysilicon layer 220 form main gates of the memory cell.

Figure 2J:
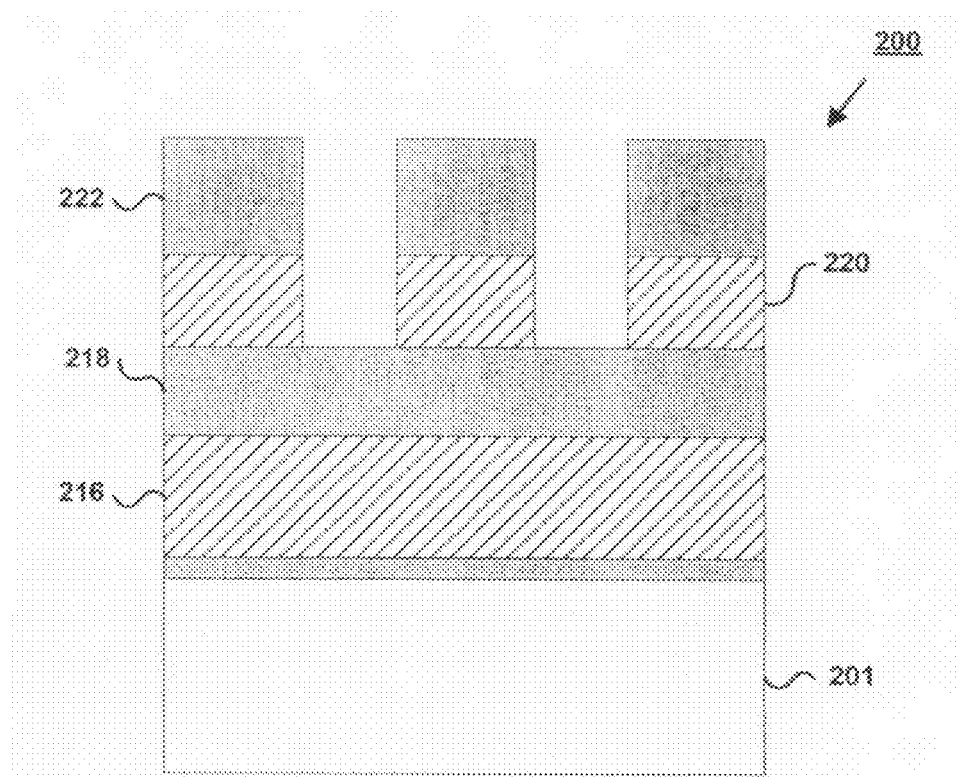
Figure 2K:
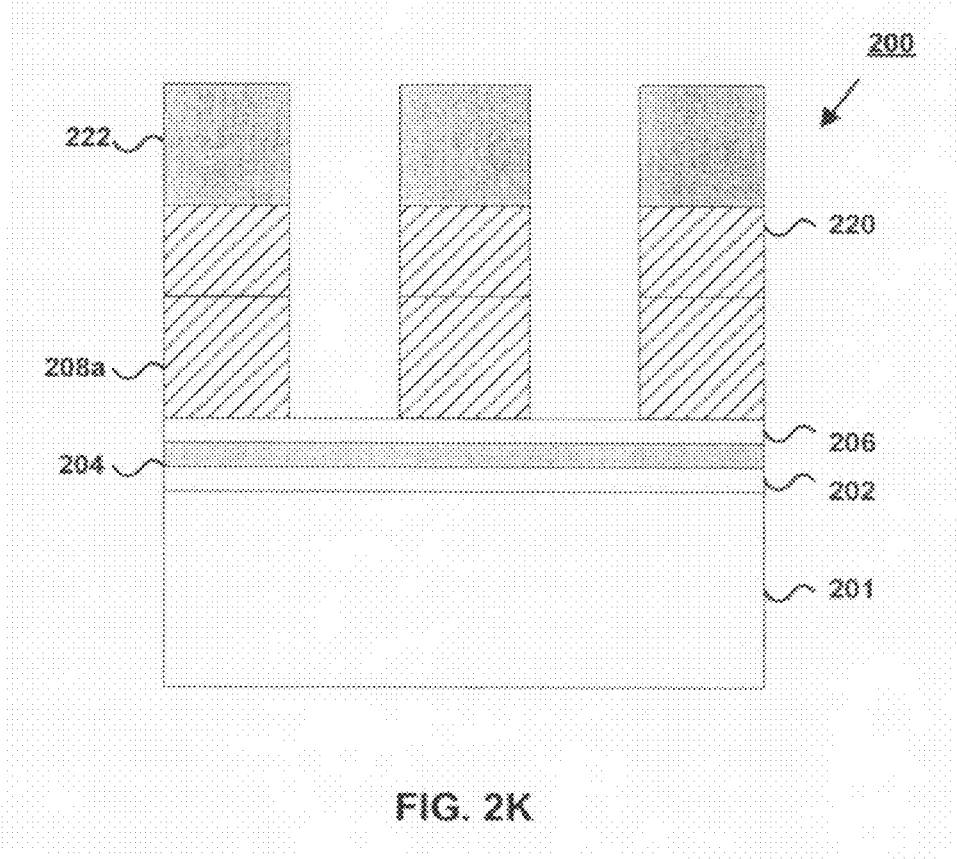

FIG. 2J is a cross-section of FIG. 2I along the line 2A-2A'. FIG. 2K is a cross section of FIG. 2I along the line 2B-2B'. As shown in FIGS. 2J and 2K, metal silicide layer 222, third polysilicon layer 220, and word-line bottom gate 208a are selectively patterned in a direction perpendicular to the first patterning direction, for example, perpendicular to the y-direction along which the series of first patterned lines were formed, as shown in FIG. 2B. The patterning is performed by, for example, dry etching, using chemicals that have a high selectivity of polysilicon relative to oxide. In an embodiment consistent with the present invention, $HBr/O_2$ is used as a dry etchant to obtain a high selectivity of polysilicon relative to oxide, and the dry etching is performed to selectively pattern metal silicide layer 222, third polysilicon layer 220, and word-line bottom gate 208a. As shown in FIG. 2J, plasma dielectric 218 again acts as a mask in the patterning process to protect the profile of sub-gate 216, thus masking sub-gate 216 again without the need of an additional mask. As shown in FIG. 2K, the selective patterning forms word-lines in, for example, the x-direction that include metal silicide layer 222 and third polysilicon layer 220.

Figure 3:
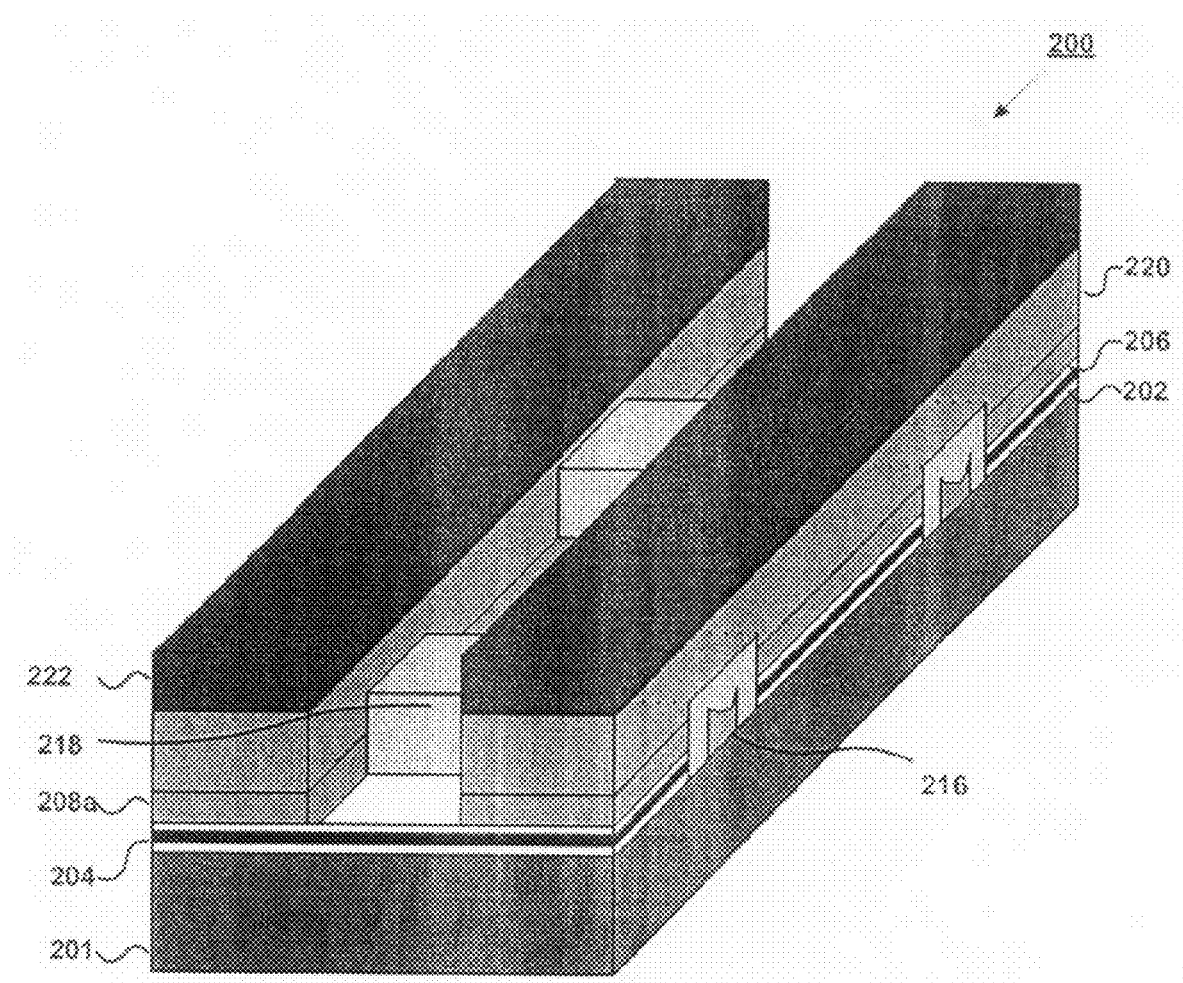
FIG. 3 shows a three-dimensional representation of a memory cell made by a method of manufacturing consistent with the present invention.

FIG. 3 shows a three-dimensional representation of memory device 200 made by a method of manufacturing consistent with the present invention. As shown in FIG. 3, metal silicide layer 222 and third polysilicon layer 220 together form word-lines. As explained above with reference to FIGS. 2I and 2K, unmasked portions of bottom word-line gate 208a extending in the y-direction are removed during the etching of metal silicide 222 and polysilicon 220 to form word-lines. During the same etching, plasma dielectric 218 masks sub-gate 216 such that sub-gate 216 remains, as was also shown in FIG. 2J.

Figure 4:
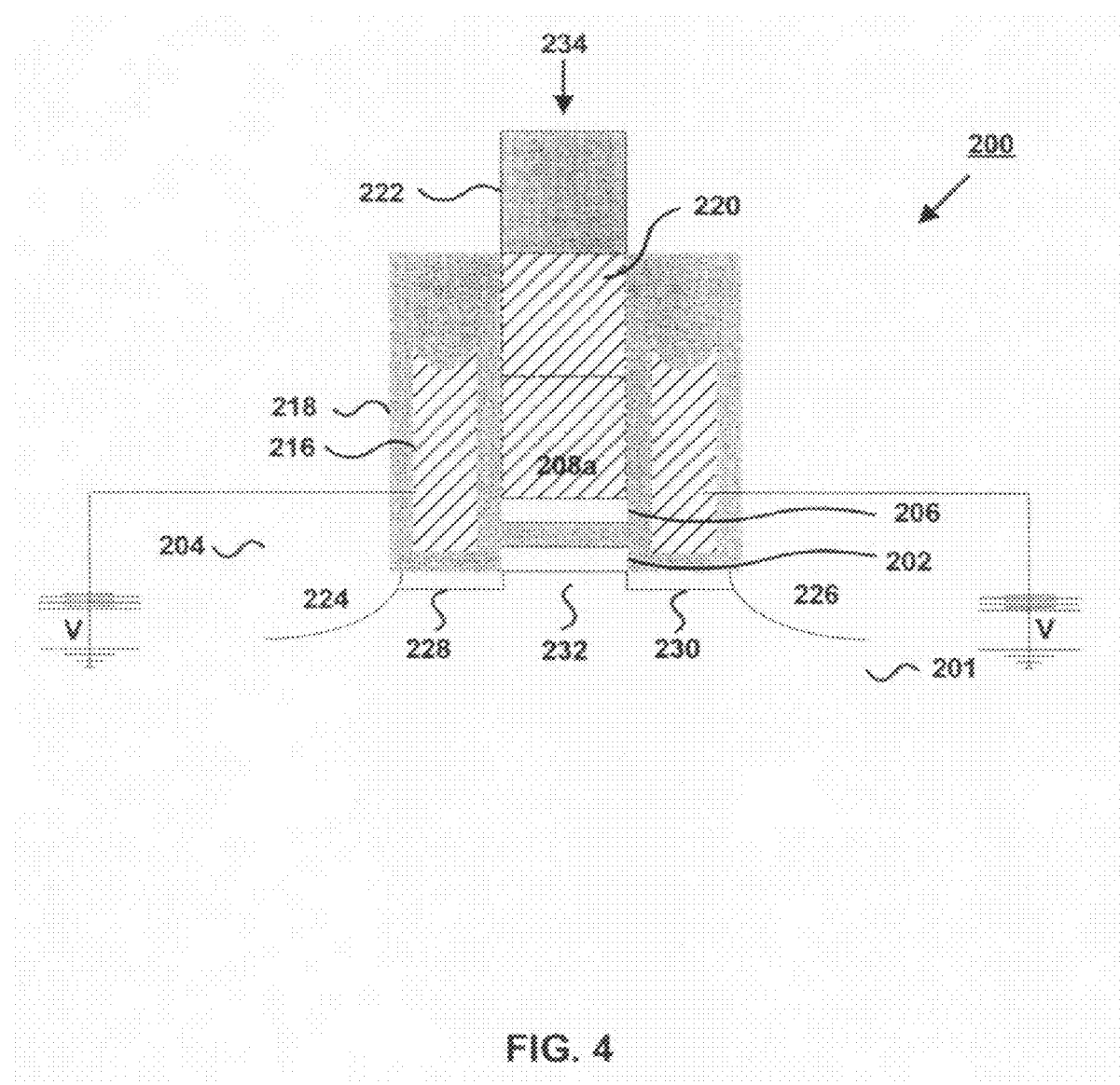
FIG. 4 shows the operation of a memory cell made by a method of manufacturing consistent with the present invention.

FIG. 4 shows the operation of a memory cell 200 consistent with an embodiment of the present invention. Substrate 201 may include diffusion regions 224 and 226, and a channel region 232. In one aspect, substrate 201 is doped with n-type impurities, and diffusion regions 224 and 226 are doped with p-type impurities. A main gate 234 comprises metal silicide layer 222, third polysilicon layer 220, and word-line bottom gate 208a. Conventional methods of manufacturing non-volatile memory devices typically use an implantation region within the array of memory cells to form bit-lines. However, in an embodiment consistent with the present invention, the bit-line is formed by a voltage V, applied to sub-gate 216. Application of voltage V forms a transient state inversion layer 228 or 230 in semiconductor substrate 201 when programming, erasing, or reading the memory cells in an array. Transient state inversion layer 228 or 230 and main gate structure 234 constitute a p-type MOS transistor, where transient state inversion layers 228 and 230 are the source and drain thereof. Moreover, in an embodiment consistent with the present invention, the application of a voltage V to sub-gate 216 will form transient state inversion layers 228 or 230 that further serve as transient bit-lines. Due to the integration of the transient bit-line and the source/drain region in inversion layer 228 or 230, the programming, erasing, and reading voltages can be applied through the transient bit-line. When voltage V is no longer applied to sub-gate 216, inversion layer 228 or 230 is not present, and the transient bit-line disappears. Thus, unlike traditional implanted bit-lines, in accordance with embodiments consistent with the present invention a bit-line is only present in the memory array when a programming, erasing or reading operation is being performed.

Further, in memory device 200, the addition of metal silicide layer 222 on the main gate/word-line effectively reduces the word-line resistance, allowing many memory cells to be closely spaced to form a high density memory array. Moreover, providing the capability to apply a voltage V to sub-gate 216 to form a transient state inversion layer 228 or 230 bit-line during the programming, reading, or erasing of the device eliminates the need for implanting a bit-line and reduces the thermal budget associated with conventional manufacturing methods. By using the inversion bit-line technique, non-volatile memory devices manufactured consistent with an embodiment of the present invention are better able to avoid short channel effects due to the absence of a channel punch-through as the size of the memory cell is scaled. The improved scalability of a non-volatile memory manufactured consistent with an embodiment of the present invention allows for more memory cells to be placed in an array, and more arrays to be placed in a memory device.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A non-volatile semiconductor device, comprising:
   a semiconductor substrate;
   a charge-trapping stack located over at least a first portion of the semiconductor substrate;
   a sub-gate over at least a second portion of the semiconductor substrate; and
   a main gate over the charge-trapping stack,
   wherein the main gate comprises a metal silicide.

2. The device according to claim 1, wherein the charge-trapping stack comprises:
   a first oxide over a portion of the semiconductor substrate;
   a nitride over the first oxide; and
   a second oxide over the nitride.

3. The device according to claim 1, wherein the charge-trapping stack comprises:
   a first oxide over a portion of the semiconductor substrate;
   a first nitride over the first oxide;
   a second oxide over the first nitride;
   a second nitride over the second oxide; and
   a third oxide over the second nitride.

4. The device according to claim 1, wherein the charge-trapping stack comprises:
   a first oxide over a portion of the semiconductor substrate;
   a high-k material over the first oxide; and
   a second oxide over the high-k material.

5. The device according to claim 4, wherein the high-k material has a dielectric constant greater than 4.

6. The device according to claim 4, wherein the high-k material comprises aluminum oxide or hafnium dioxide.

7. The device according to claim 1, further comprising:
   a hard mask over the sub-gate,
   so that application of a voltage to the sub-gate will form a transient state inversion layer.

8. The device according to claim 7, wherein the formed transient state inversion layer is the bit-line of the non-volatile semiconductor memory device.

9. The device according to claim 7, wherein the formed transient state inversion layer is the source or drain of a transistor of the non-volatile semiconductor memory device.

10. The device according to claim 7, wherein the formed transient state inversion layer is only present during application of the voltage to the sub-gate.

11. The device according to claim 7, wherein the hard mask comprises a plasma oxide.

12. The device according to claim 1, further comprising:
a transient inversion layer in the second portion of the substrate when a voltage is applied to the sub-gate.

13. The device according to claim 1, further comprising:
an insulation layer between the sub-gate and the main gate.

14. The device according to claim 1, wherein the insulation layer comprises an oxide liner.

15. The device according to claim 1, wherein the main gate forms a portion of a word-line.

16. The device according to claim 15, wherein the word-line further comprises:

a polysilicon bottom word-line gate; and
a main gate word-line comprising a metal silicide, a polysilicon, or a combination thereof.

17. The device according to claim 1, wherein the charge-trapping stack comprises:
a first insulating layer over a portion of the semiconductor substrate;
a charge-trapping layer over the first insulating layer; and
a second insulating layer over the charge-trapping layer.

* * * * *